United States Patent
Hobbs

(10) Patent No.: US 8,400,173 B2
(45) Date of Patent: Mar. 19, 2013

(54) METHOD AND APPARATUS FOR THERMALLY CONDITIONING PROBE CARDS

(75) Inventor: Eric D. Hobbs, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 838 days.

(21) Appl. No.: 12/492,177

(22) Filed: Jun. 26, 2009

(65) Prior Publication Data

US 2010/0327891 A1     Dec. 30, 2010

(51) Int. Cl.
*G01R 31/00* (2006.01)
*G01R 31/10* (2006.01)

(52) U.S. Cl. .......... 324/750.03; 324/750.06; 324/756.03

(58) Field of Classification Search .................. None
See application file for complete search history.

(56) References Cited

U.S. PATENT DOCUMENTS

| 7,262,624 | B2 * | 8/2007 | Miller ...................... 324/754.07 |
| 2005/0285613 | A1 * | 12/2005 | Isakharov et al. ............. 324/765 |
| 2007/0018664 | A1 * | 1/2007 | Bae et al. ...................... 324/754 |
| 2007/0145989 | A1 * | 6/2007 | Zhu et al. ...................... 324/754 |
| 2008/0116925 | A1 * | 5/2008 | Sunohara et al. ............. 324/761 |
| 2008/0272795 | A1 * | 11/2008 | Janusch ........................ 324/760 |

* cited by examiner

*Primary Examiner* — Vinh Nguyen
(74) *Attorney, Agent, or Firm* — Kirton McConkie

(57) ABSTRACT

Embodiments of probe cards and methods for fabricating and using same are provided herein. In some embodiments, an apparatus for testing a device (DUT) may include a probe card configured for testing a DUT; a thermal management apparatus disposed on the probe card to heat and/or cool the probe card; a sensor disposed on the probe card and coupled to the thermal management apparatus to provide data to the thermal management apparatus corresponding to a temperature of a location of the probe card; a first connector disposed on the probe card and coupled to the thermal management apparatus for connecting to a first power source internal to a tester; and a second connector, different than the first connector, disposed on the probe card and coupled to the thermal management apparatus for connecting to a second power source external to the tester.

13 Claims, 6 Drawing Sheets

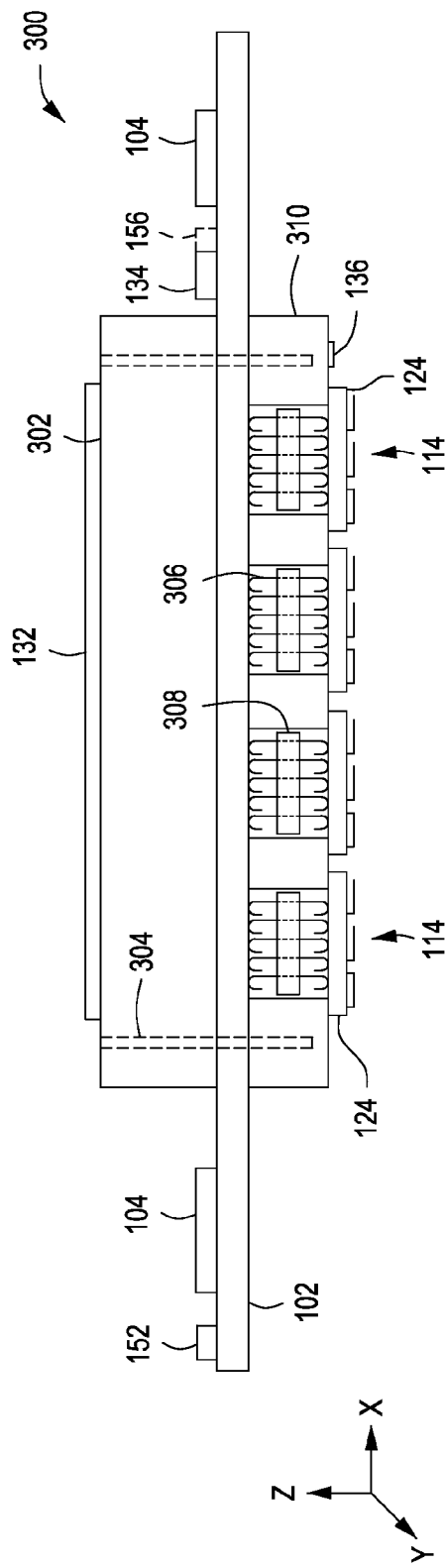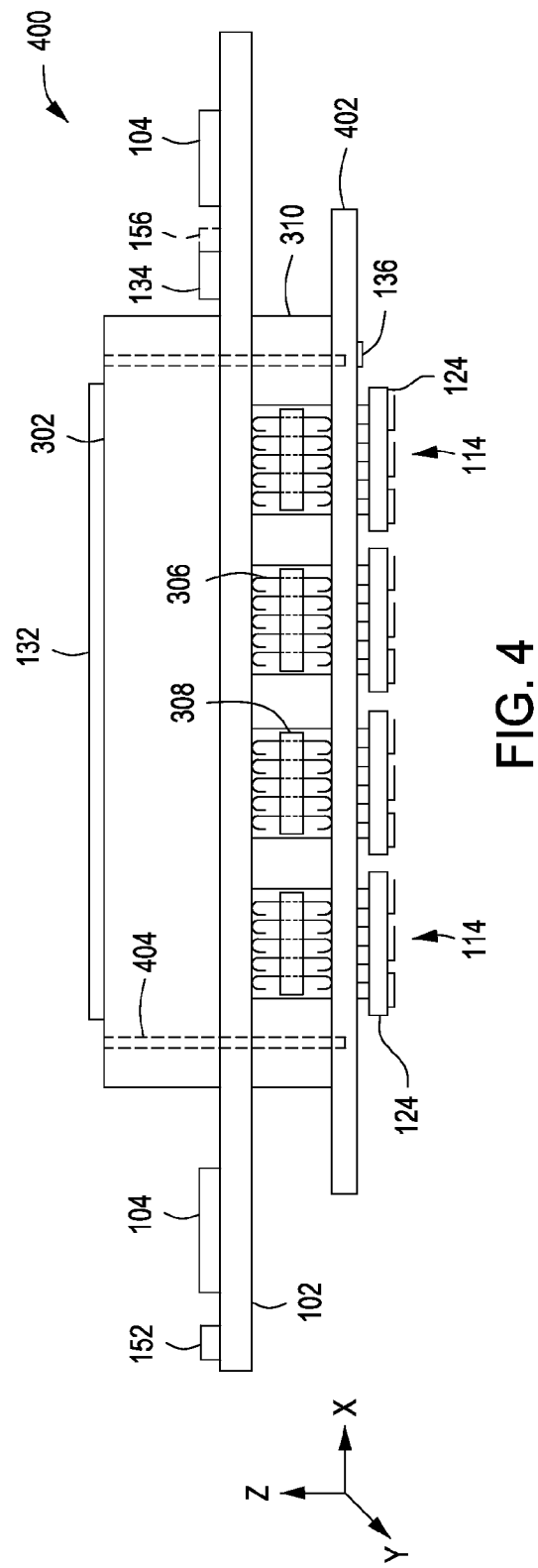

METHOD AND APPARATUS FOR THERMALLY CONDITIONING PROBE CARDS

BACKGROUND

1. Field

Embodiments of the present invention generally relate to semiconductor testing.

2. Description of the Related Art

When testing partially or fully completed semiconductor devices formed on a semiconductor substrate, such as integrated circuits and the like, a plurality of contact elements, or probes, are typically brought into contact with the device to be tested—sometimes referred to as a device under test (or DUT). The probes are typically part of a probe card (or probe card assembly) or other similar device coupled to a test mechanism (such as a tester, or prober) that brings the probe card probes into contact with terminals on the DUT to facilitate providing electrical signals to the DUT in accordance with a predetermined testing protocol.

Such testing often can occur at high temperatures, for example up to about 150 degrees Celsius, which might require a preheat time for the probe card to reach a steady state suitable to begin testing of the DUT. However, test mechanism downtime while waiting for the probe card to heat up can be costly and can reduce the availability of the equipment for testing. Moreover, the probe card may have a large mass (for example, due to stiffening members or assemblies for ensuring alignment of the probes extending from the probe card), which further exacerbates the preheat time problem due to the large mass taking longer to heat or cool.

Accordingly, there is a need for an apparatus for use in testing semiconductor devices that can reduce the time required to heat and/or cool a probe card.

SUMMARY

Embodiments of probe cards and methods for designing, fabricating, testing, and using same are provided herein. In some embodiments, an apparatus for testing a device (DUT) may include a probe card configured for testing a DUT; a thermal management apparatus disposed on the probe card to heat and/or cool the probe card; a sensor disposed on the probe card and coupled to the thermal management apparatus to provide data to the thermal management apparatus corresponding to a temperature of a location of the probe card; a first connector disposed on the probe card and coupled to the thermal management apparatus for connecting to a first power source internal to a tester; and a second connector, different than the first connector, disposed on the probe card and coupled to the thermal management apparatus for connecting to a second power source external to the tester.

In some embodiments, a method for conditioning a probe card prior to testing a device (DUT) may include providing power from a second power source external to a tester to a thermal management apparatus disposed on a probe card having a first connector coupled to the thermal management apparatus for connecting to a first power source internal to the tester and a second connector, different than the first connector, coupled to the thermal management apparatus and connected to the second power source; and bringing the probe card to a desired temperature using the thermal management apparatus.

In some embodiments, a method for fabricating a probe card for testing a device (DUT) may include coupling a thermal management apparatus disposed on a partially fabricated probe card to a second power source external to a tester; bringing the probe card to a desired temperature using the thermal management apparatus; and positioning a probe tip on the partially fabricated probe card while the probe card is at the desired temperature.

BRIEF DESCRIPTION OF THE DRAWINGS

So that the manner in which the above recited features of the present invention can be understood in detail, a more particular description of the invention, briefly summarized above and others described below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 depicts a schematic side view of a probe card in accordance with some embodiments the invention.

FIG. 4 depicts a schematic side view of a probe card in accordance with some embodiments the invention.

Where possible, identical reference numerals are used herein to designate identical elements that are common to the figures. The images used in the drawings are simplified for illustrative purposes and are not necessarily depicted to scale.

DETAILED DESCRIPTION

Figure 1:
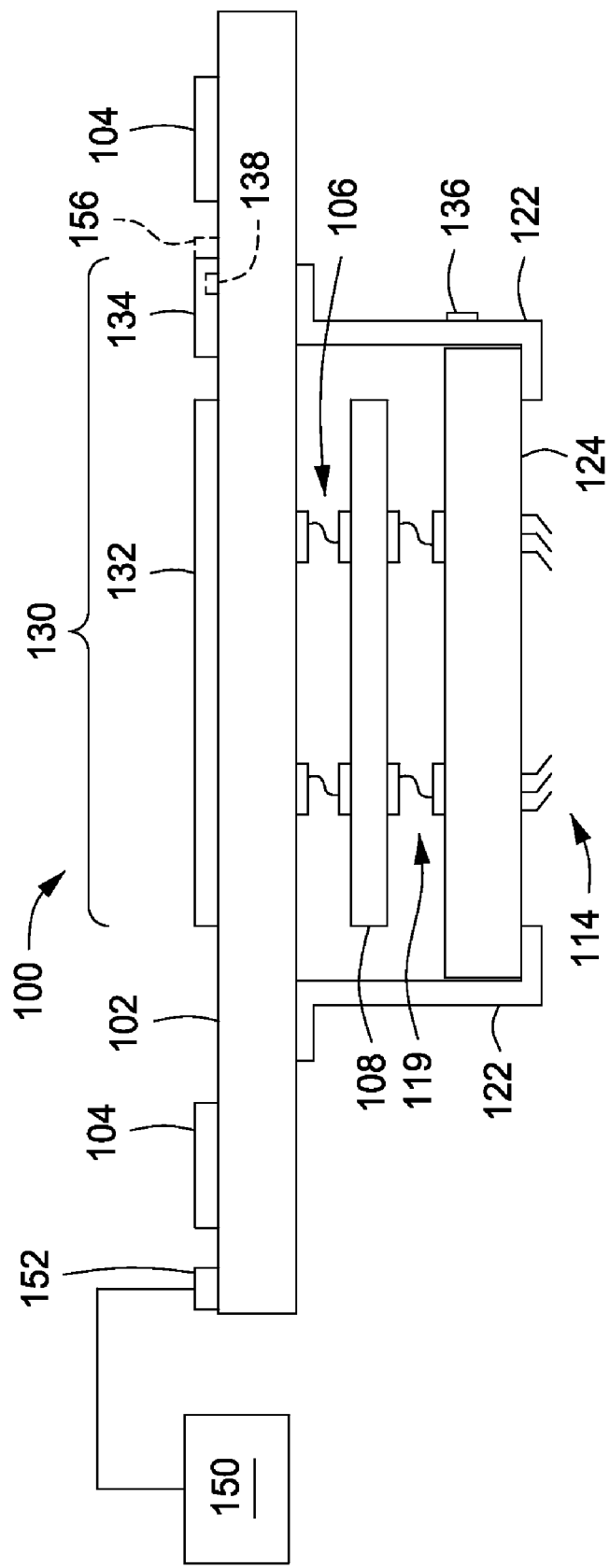
FIG. 1 depicts a schematic side view of a probe card in accordance with some embodiments the invention.

This specification describes exemplary embodiments and applications of the invention. The invention, however, is not limited to these exemplary embodiments and applications or to the manner in which the exemplary embodiments and applications operate or are described herein. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one or more of the listed elements by itself or in any combination.

Embodiments of the invention can relate to methods and apparatus for thermally conditioning probe cards outside of a testing environment. Such thermal conditioning of the probe card may occur prior to assembly of the probe card, prior to or during testing of the probe card, and/or prior to use of the probe card to test a device (e.g., a DUT). As such, embodiments of the invention may include assembly of a probe card at a desired temperature, testing of a probe card at a desired temperature, and/or thermally conditioning a probe card to a desired temperature immediately prior to use of the probe card for DUT testing. The desired temperature may be an operating temperature (e.g., the temperature of the probe card at which DUT testing is to be performed) or a temperature selected to compensate for any additional changes in temperature that may occur when installing the probe card in a tester or other testing environment. When referring to the temperature of the probe card, it is contemplated that each component of the probe card may have a distinct transient and/or steady state temperature and it is not required that all components of the probe card be maintained at the same temperature. Although the methods and apparatus described herein mainly relate to thermally conditioning probe cards outside of a testing environment, it is contemplated that some embodiments of the present invention may also relate to thermal conditioning of a probe card within a testing environment.

Embodiments of the present invention may advantageously allow for more accurate design, assembly, and/or testing of probe cards by allowing such design, assembly, and test to occur at operating/testing temperatures utilized to test a device. Embodiments of the present invention may advantageously allow for more accurate assembly of probe cards by allowing such assembly to occur at operating/testing temperatures. Embodiments of the present invention may advantageously allow for reduction of downtime of a tester by facilitating thermal conditioning of the probe card to occur outside of the tester.

Figure 2:
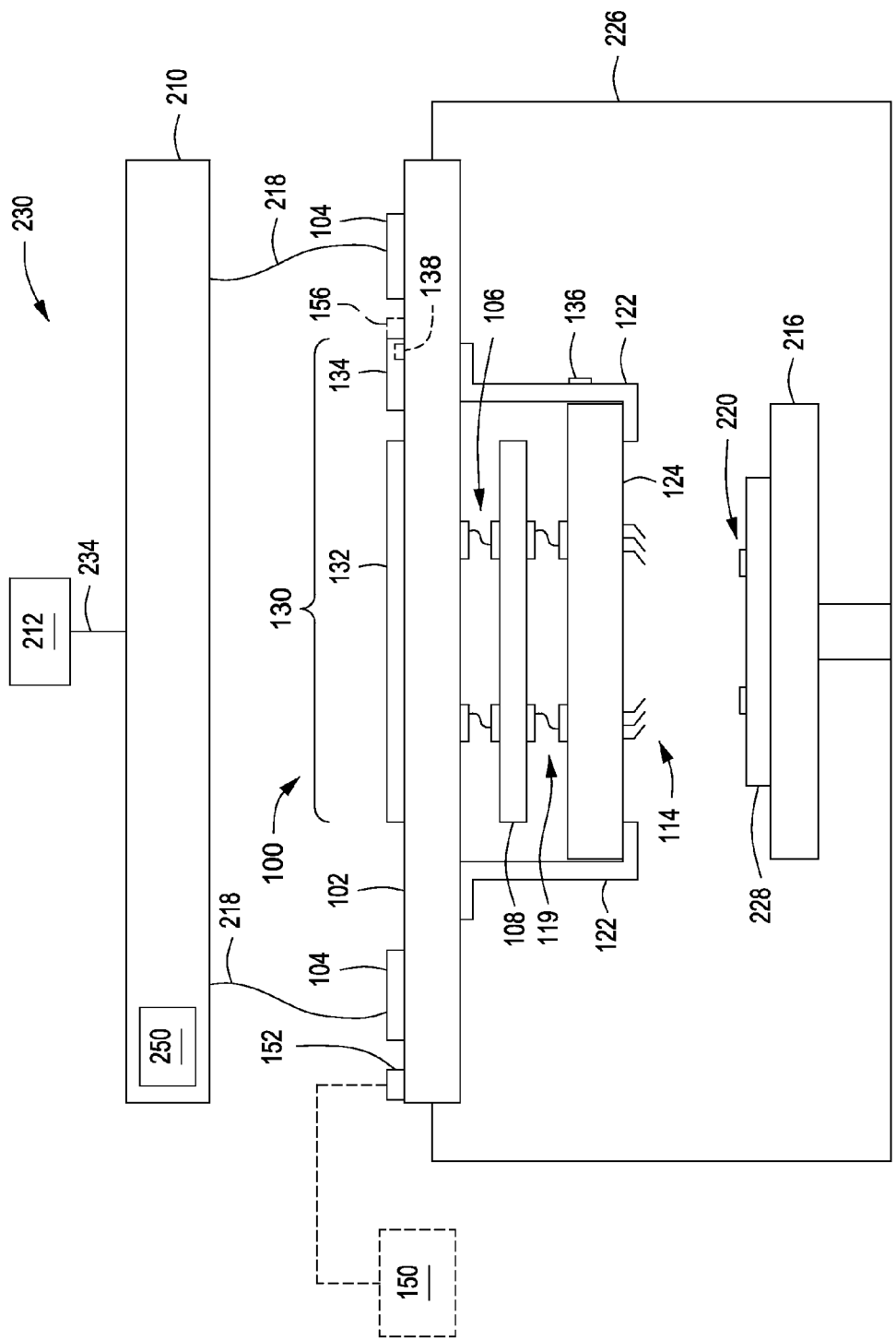
FIG. 2 depicts a schematic side view of a tester having a probe card in accordance with some embodiments the invention installed therein.

FIG. 1 depicts a schematic side view of a probe card 100 in accordance with some embodiments the invention. FIG. 2 depicts a schematic side view of a test system 230 (e.g., a tester) having the probe card 100 installed therein. For ease of understanding, the following description relates to both FIGS. 1 and 2. Reference numerals beginning with the number 1 are shown at least in FIG. 1. Reference numerals beginning with the number 2 are depicted in FIG. 2.

The exemplary probe card 100 illustrated in FIG. 1 can be used to test one or more electronic devices (e.g., a device under test, or DUT, represented by DUT 228 in FIG. 2). For example, the probe card 100 may be installed in a test system to act as an interface between a test system controller of the test system and the DUT 228. FIG. 2 depicts a schematic view of an exemplary test system 230 for testing a DUT 228 and having a probe card assembly in accordance with some embodiments of the present invention installed therein. The test system 230 can generally include a prober 226, the probe card assembly 100, a test system controller 212, and test instruments 210.

The prober 226 can include a stage 216 for mounting a DUT 228 to be tested and may have the probe card assembly 100 mounted thereto or otherwise disposed in an upper portion of the prober 126 above the stage 116. The stage 116 can be movable to contact the DUT 228 with the probe card assembly 100, as discussed in more detail below. The DUT can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices.

The test system controller 212 may comprise, for example, a host computer (e.g., a general purpose computer) and may be coupled to the test instruments 210 by a communication link 234. Test data can be generated by the test instruments 210 and transmitted through the probe card assembly 100 to the DUT 228. Test results can then be provided from the DUT 228 back through the probe card assembly 100 to the test instruments 210. The test instruments 210 may transmit the test results to the test system controller 212 for analysis. Overall control of the test instruments 210 during testing may be orchestrated by the test system controller 212. The test instruments 210 may include one or more first power sources, shown as first power source 250, for providing a source of power during testing of the DUT 228.

The probe card 100 includes electrical connectors 104 (e.g., first connectors) configured to make electrical connections with a plurality of communications channels 218 from the test instruments 210 and/or the test system controller 212. The probe card 100 also includes one or more probes 114 configured to be pressed against, and thus make electrical connections with, one or more input and/or output terminals 220 of DUT 228. The probes 114 are typically configured to correspond to the terminals 220 of the DUT 228 and may have a desired geometry to provide temporary electrical contact to some or all of the terminals 220 of the DUT 228.

The probe card 100 may include one or more substrates configured to support the connectors 104 and the probes 114 and to provide electrical connections therebetween. The exemplary probe card 100 shown in FIG. 1 has three such substrates, although in other implementations, the probe card 100 can have more or fewer substrates. In the embodiment depicted in FIG. 1, the probe card 100 includes a wiring substrate 102, an interposer substrate 108, and a probe substrate 124. The wiring substrate 102, the interposer substrate 108, and the probe substrate 124 can generally be made of any type of suitable material or materials, such as, without limitation, printed circuit boards, ceramics, organic or inorganic materials, and the like, or combinations thereof.

Electrically conductive paths (not shown) may be provided from the connectors 104 through the wiring substrate 102 to a plurality of electrically conductive spring interconnect structures 106. Non-limiting examples of suitable electrically conductive paths through the wiring substrate 102 include providing a connection feature (such as a contact pad) on either side of the wiring substrate 102 and electrically coupling the connection features. For example, vias may be provided between the connection features if aligned, and/or trace routing on one or more intermediate layers of the wiring substrate 102 may be provided where the connection features are not aligned. Other electrically conductive paths (similar to the conductive paths above) may be provided from the spring interconnect structures 106 through the interposer substrate 108 to a plurality of electrically conductive spring interconnect structures 119. Still other electrically conductive paths (similar to the conductive paths above) may further be provided from the spring interconnect structures 119 through the probe substrate 124 to the probes 114. The electrically conductive paths through the wiring substrate 102, the interposer substrate 108, and the probe substrate 124 can comprise electrically conductive vias, traces, or the like, that may be disposed on, within, and/or through the wiring substrate 102, the interposer substrate 108, and the probe substrate 124.

The wiring substrate 102, the interposer substrate 108, and the probe substrate 124 may be held together by one or more brackets 122 and/or other suitable means (such as by bolts, screws, or other suitable fasteners). The configuration of the probe card 100 shown in FIG. 1 is exemplary only and is simplified for ease of illustration and discussion and many variations, modifications, and additions are contemplated. For example, a probe card may have fewer or more substrates (e.g., 102, 108, 124) than the probe card 100 shown in FIG. 1. As another example, a probe card may have more than one probe substrate (e.g., 124), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card 100 shown in FIG. 1 and that the probe card assemblies described in the aforementioned patents and application may benefit from the use of the inventive resilient contact elements disclosed herein. FIG. 1 depicts just one illustrative example of the types of probe card assemblies that may incorporate resilient contact elements as described herein and many other probe card assemblies having various configurations are within the scope of this invention (see, for example, probe cards described below with respect to FIGS. 5 and 6).

Testing of the DUT 228 can often occur at temperatures different than room temperature, for example up to about 150 degrees Celsius or as low as about −40 degrees Celsius, which normally might require a conditioning time for the probe card 100 to reach a state suitable to begin testing of the DUT 228. Accordingly, the probe card 100 is configured to provide for thermally conditioning the probe card 100 externally from the test system 230, thereby reducing downtime of the test system 230 due to waiting for the probe card 100 to reach a state suitable for testing the DUT 228.

In some embodiments, the probe card 100 may include a thermal management apparatus 130 to assist in controlling the temperature of the probe card 100. The thermal management apparatus 130 may include one or more temperature control devices 132 disposed in or on the probe card to heat and/or cool the probe card 100. The temperature control device 132 may be any suitable device for heating and/or cooling the probe card 100. For example, the temperature control device 132 may be a heating device, a cooling device, a thermoelectric device (such as a Peltier cell), or the like.

The temperature control device 132 of the probe card 100 can be operated to facilitate bringing the temperature of the probe card 100 to a suitable state prior to installing the probe card 100 in the test system 230. For example, the probe card 100 may be heated to a temperature near that of the testing temperature of the DUT 228 to advantageously reduce the time elapsed once the probe card 100 is installed in the test system 230 (e.g., in the prober 226). In some embodiments, the probe card 100 may be heated to a temperature near that of the testing temperature of the DUT 228 to facilitate assembly and/or testing of the probe card 100 at or near the testing temperature. Such assembly and/or testing of the probe card 100 at or near the testing temperature may advantageously provide for more accurate alignment and contact between the probe card 100 and the terminals of the DUT 228.

The temperature control device 132 may be any suitable device for heating and/or cooling the probe card as desired. In embodiments where heating is provided, the temperature control device 132 may include one or more heaters, such as resistive heaters or the like. For example, in some embodiments a heating element, such as a resistive heating element, may be disposed on the probe card 100. Alternatively or in combination, in some embodiments, the probe card 100 can include a multilayer substrate comprising one or more layers of conductive material disposed on or between one or more layers of insulating material. Electrically conductive pads or traces can be disposed on and between insulating layers and electrically conductive vias can be provided through one or both of layers to electrically connect pads or traces on different layers. The one or more of electrically conductive pads or traces can comprise a material that generates heat in response to current passing through the material. Current can be supplied to the one or more pads or traces, and/or other heating devices, in an amount needed to heat the probe card 100 to a desired temperature.

Alternatively or in combination, the temperature control device 132 may cool the probe card 100 to a desired temperature and/or state. For example, In embodiments where cooling is provided, the temperature control device 132 may include one or more thermoelectric devices (such as a Peltier cell) that may cool the probe card 100 upon the application of an electrical current to the thermoelectric device. Alternatively or in combination, in some embodiments, the temperature control device 132 can comprise tubes through which heated and/or cooled liquid or gas is passed to control the temperature of the probe card 100 as desired.

As such, the temperature control device 132 may be utilized to heat or cool the probe card 100 to a desired temperature or state, such as proximate a temperature utilized in a test protocol for testing a DUT. Although specific examples of temperature control devices 132 are provided, it is contemplated that any suitable temperature control device may be utilized in accordance with the teachings provided herein. Moreover, one or more temperature control devices 132 can be disposed in any suitable location in and/or on the probe card 100 that facilitates the controlled heating and/or cooling thereof as discussed herein.

The thermal management apparatus 130 further includes a temperature controller 134, which may be coupled to the temperature control device 132, for controlling the operation of the temperature control device 132. The temperature controller 134 may be any suitable controller configured to control the operation of the temperature control device 132 and may be a separate controller or may be part of another controller that controls operation of the probe card 100. The temperature controller 134 may control the operation of the temperature control device 132 in response to data provided by one or more sensors (e.g., sensor 136, discussed below).

For example, the temperature controller 134 may include operating setpoints for controlling the temperature control device 132 to bring the probe card 100, or a component thereof, to one or more desired states corresponding to respective one or more testing temperatures. In some embodiments, the temperature controller 134 may be configured to detect whether the probe card 100 is disposed in a tester. For example, the temperature controller 134 may be configured to detect whether the probe card 100 is coupled to a first power source utilized during testing a DUT, a second power source different than the first power source, or both (as discussed in more detail below). The temperature controller may be configured to alter the operation of the probe card 100 dependent upon the power connections made thereto, as discussed in more detail below.

The probe card 100 may further include one or more sensors (one sensor 136 depicted in FIGS. 1 and 2) to provide data to the thermal management apparatus 130 (e.g., to the temperature controller 134) corresponding to a temperature of a location of the probe card 100. The sensor(s) 136 may be disposed at any suitable location to measure the temperature of the probe card 100 and/or components of the probe card 100 (such as, for example, the probe substrate 124). The sensor 136 may be, for example, a thermocouple, a thermistor, or other suitable sensor that can sense a metric corresponding to temperature and provide that metric to the temperature controller 134. In some embodiments, the sensor may be integral with the temperature control device 132. For example, in some embodiments, the temperature control device 132 may include one or more resistive heaters. The resistive heater may be utilized as a sensor by monitoring the resistance of the resistive heater, which may vary with temperature.

One or more of the connectors 104 (e.g., first connectors) disposed on the probe card 100 may be configured to couple power to the probe card 100, and the thermal management apparatus 130, from the first power source 250 that powers the probe card and/or provides signals through the probe card 100 during DUT testing when installed in a tester (e.g., in the prober 226). One or more electrical connectors 152 (e.g., second connectors), different than the first connectors, may be disposed on the probe card 100 to couple power to the thermal management apparatus 130 from a second power source 150 different than the first power source 250. The connector 152 may be any suitable electrical connector, such as a zero insertion force (ZIF) connector, pogo pins, a land grid array (LGA) connector, or the like. Electrically conductive paths (not shown) may be provided from the connectors 152 to the temperature control device 132 and/or the temperature controller 134 and/or other components of the probe card 100.

In general, the second power source 150 may be any suitable source of power that is different than the first power source 250 such that the power utilized to control the probe card thermal control systems (e.g., the temperature control device 132, the temperature controller 134, and the like) can be separate from the first power source 250 utilized for testing the DUT 228, thereby preventing undesirable power fluctuations during testing due to power consumption by the thermal control systems. Although referred to in singular, either or both of the first power source 250 and the second power source 150 may be a plurality of power sources or supplies that together operate to provide the necessary power utilized in connection with the probe card and testing systems disclosed herein.

In some embodiments, the second power source 250 may be any suitable source of power provided remotely from the tester. In some embodiments, the second power source 250 may be utilized when the probe card 100 is not disposed in the tester. For example, the second power source 250 may be a battery, a generator, a facilities source of power (e.g., utility-provided power delivered via an alternating current (AC) wall outlet or similar connection), a DC power supply plugged into an AC outlet, or the like. In some embodiments where power is provided via AC, an AC to DC converter 156 (depicted in FIG. 1 in phantom) may be provided. Alternatively or in combination, in some embodiments, the second power source 150 may be a power supply provided in the tester (for example, in the test instruments 210, similar to the first power source 250).

Figure 8:
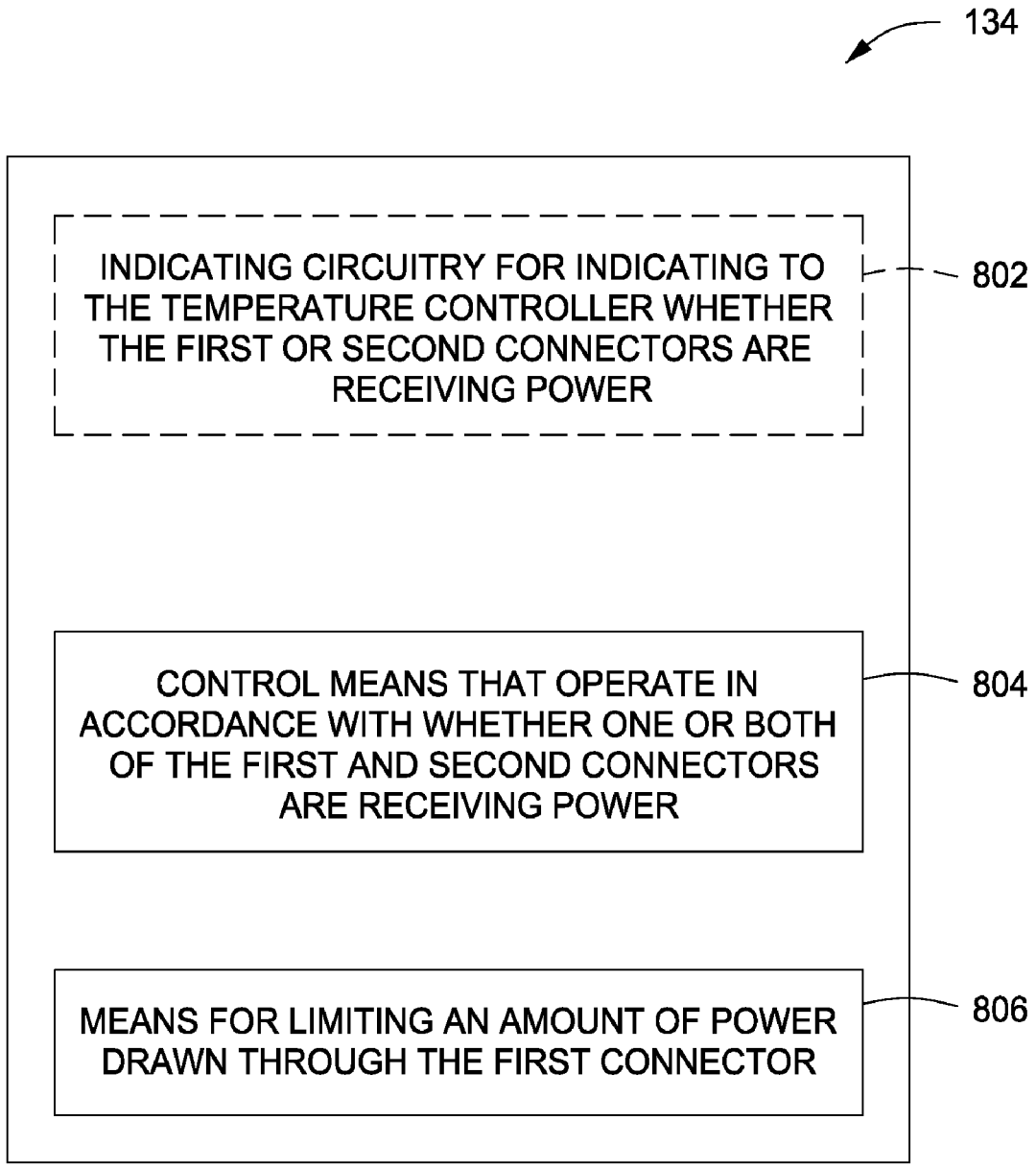
FIG. 8 depicts a schematic diagram of a temperature controller in accordance with some embodiments of the invention.

In some embodiments, an indicating device 138 may be provided to indicate to the temperature controller 134 whether the first or second connectors (e.g., 104, 152) are receiving power. The indicating device may be any suitable device that can indicate to the temperature controller 134 whether the first or second connectors are receiving power. For example, when a first connector and/or a second connector is connected, the indicating device will indicate if the connectors are receiving power. The indicating device could be circuitry (e.g., on the temperature controller or that communicates with the temperature controller), a switch, a relay, or the like. In some embodiments, the indicating device may be electronic circuitry. Such circuitry could be part of a connector, a separate component on probe card, or a part of the temperature controller. As illustrated in FIGS. 1-2, in some embodiments the indicating device may be circuitry contained in the controller. As illustrated in FIG. 8, in some embodiments, the temperature controller 134 may include indicating circuitry 802 for indicating to the temperature controller whether the first or second connectors are receiving power.

In some embodiments, the thermal management apparatus 130 may include control means that operate in accordance with whether one or both of the first and second connectors are receiving power. Such control means may include circuitry, software, firmware, or combinations thereof. For example, such control means may be part of the temperature controller 134, or part of another controller (such as the test system controller 212) that may communicate with the temperature controller 134. For example, in some embodiments and as illustrated in FIG. 8, the temperature controller 134 may include circuitry 804 that provides control means that operate in accordance with whether one or both of the first and second connectors are receiving power.

The control means may be configured to control the operation of the thermal management apparatus 130 depending upon whether one or both of the first and second connectors are receiving power, as indicated by the indicating device 138. For example, where both connectors are receiving power, the control means may cause the thermal management apparatus 130 to draw full power required from the second power source, or a maximum available power from the second power source prior to drawing any power from the first power source. In some embodiments, the control means can change an operational mode, a duty cycle, a power drawn, and the like, and combinations thereof, based upon available power from the first and/or the second power sources.

In some embodiments, the thermal management apparatus 130 may include means for limiting an amount of power drawn through the first connector (e.g., connector 104). In some embodiments, the amount of power drawn through the first connector may be limited to an operational amount that is less than a maximum amount of power that can be drawn through the first connector. Drawing too much power from the first connector can lead to blowing a fuse on the first power supply, which, if utilized for generating test signals, could cause a voltage droop that affects the test signals, and could undesirably cause a reduction in customer DUT yield. Examples of suitable means for limiting may include circuitry, software, firmware, or combinations thereof.

For example, in some embodiments, if both connectors coupled to the temperature controller 134, switches could control how much power is going through each of the first and second connectors. Circuitry, software, firmware, or a combination thereof may control the position of the switches to control the power being drawn from each of the first and/or second power sources. In some embodiments, the duty cycle of the first power source may be controlled to limit the amount of power drawn therefrom. In some embodiments, one or more variable resistors could be provided to vary the resistive path between the first power source and the thermal management apparatus 130 to limit the amount of power drawn from the first power source. For example, switches may be respectively coupled between the first power source and a plurality of resistive heaters (according to some embodiments of the temperature control device 132) that can be configured in series or in parallel to control the power drawn from the power source (e.g., by coupling greater or fewer of the resistors). In one non-limiting example, a first connector and a second connector (respectively coupled to first power source and second power source) may be coupled to a temperature control device 1232 comprising, for illustration, three resistive heating elements. Switches can be configured such that the first power source is coupled to one resistive heating element and the second power source is coupled to two resistive heating elements. In addition, the two resistive heating elements may be configured in series or in parallel to further control power draw. In some embodiments, and as illustrated in FIG. 8, the temperature controller 134 may include circuitry 806 that provides means for limiting an amount of power drawn through the first connector.

Although described above with respect to one exemplary probe card 100, the inventive probe card 100 may be provided in a number of other configurations. For example, FIG. 3 depicts a probe card 300 according to some other embodiments of the invention. The probe card 300 can include a wiring substrate 102, a stiffener 302, a support substrate 310, interposer substrates 308, and one or more probe substrates 124. The stiffener 302 can be coupled to the support substrate 310 via pins 304 that extend through the wiring substrate 102. The wiring substrate 102 can be configured to float between the stiffener 302 and the support substrate 310. The wiring substrate 102 can support electrical connectors 104 configured to make electrical connections with the test instruments (e.g., test instruments 210 depicted in FIG. 2).

The support substrate 310 can include openings in which the interposer substrates 308 are respectively disposed. The interposer substrates 308 can electrically couple the wiring substrate 102 to the probe substrates 124. For example, each of the interposer substrates 308 may include electrically conductive spring interconnect structures 306 disposed therethrough that electrically couple the substrate 102 to respective probe substrates 124. Each of the probe substrates 124 can support one or more resilient contact elements, or probes 114. The probe substrates 124 can be mounted to the support substrate 310. The stiffener 302 and/or the support substrate 310 can provide stiffness in a "z" direction. The pins 304 can provide stiffness in a "z" direction, while being compliant in an "x" and/or "y" direction.

Electrically conductive paths (examples shown below) are typically provided from the connectors 104 through the various substrates to the probes 114. For example, in the embodiment depicted in FIG. 3, electrically conductive paths may be provided from the connectors 104 through the wiring substrate 102 to the electrically conductive spring interconnect structures 306. Other electrically conductive paths may be provided from the spring interconnect structures 306 through the probe substrates 124 to the probes 114. The electrically conductive paths through the wiring substrate 102, the interposer substrates 508, and the probe substrates 124 can comprise electrically conductive vias, traces, or the like, that may be disposed on, within, and/or through the wiring substrate 102 and the probe substrates 124. The wiring substrate 102, the interposer substrates 308, and the probe substrates 124 can generally be made of any type of suitable material or materials, such as, without limitation, printed circuit boards, ceramics, organic or inorganic materials, and the like, or combinations thereof.

FIG. 4 depicts a probe card 400 according to some other embodiments of the invention, which is similar to FIG. 3, except that the probe substrates 124 can be mounted to a mounting substrate 402. The mounting substrate 402 can be coupled to the stiffener 302 via pins 404. Each of the interposer substrates 308 may include electrically conductive spring interconnect structures 306 coupled to the mounting substrate 402. The probe substrates 124 can be electrically and mechanically coupled to the mounting substrate 402 using, for example, solder or like type connections. The substrate 402 can be configured with a coefficient of thermal expansion (CTE) that matches or nearly matches that of the DUT (e.g., DUT 228 depicted in FIG. 2) over a desired range of temperatures.

Similar to the embodiment described above with respect to FIG. 3, electrically conductive paths may be provided from the connectors 104 through the wiring substrate 102 to the electrically conductive spring interconnect structures 306. Other electrically conductive paths may be provided from the spring interconnect structures 306 through the mounting substrate 402 to the probe substrates 124. The electrically conductive paths through the mounting substrate 402 can comprise electrically conductive vias, traces, or the like, that may be disposed on, within, and/or through the mounting substrate 402. The mounting substrate 402 can generally be made of any type of suitable material or materials, such as, without limitation, printed circuit boards, ceramics, organic or inorganic materials, and the like, or combinations thereof.

Each of the probe cards 300, 400 described above may include a temperature control device 132, temperature controller 134, sensor 136, and connectors 152,104 for coupling the respective probe card 300, 400 to a first power source (e.g., 250) and a second power source (e.g., 150) in like manner as described above with respect to the probe card 100.

A probe card (e.g., 100, 300, 400) having the connector(s) 152 configured to be coupled to the second power source 150 may advantageously be coupled to a second power source 150 while not installed in a tester, such as the prober 226. As such, the probe card may be designed, tested, fabricated, and/or pre-heated prior to use in testing a device without utilizing a test-cell, thereby increasing the availability of the tester for use with other probe cards, which may advantageously provide greater tester uptime and throughput.

Figure 5:
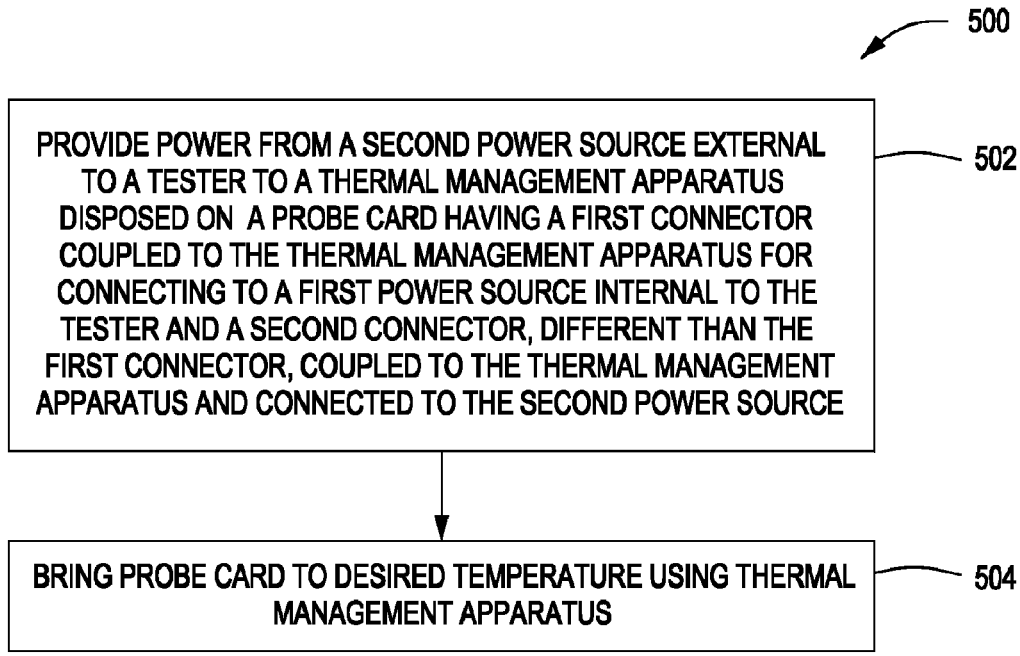
FIG. 5 depicts a flow chart of a method for thermally conditioning a probe card prior to testing a device (DUT) in accordance with some embodiments of the invention.

For example, FIG. 5 depicts a flow chart of a method 500 for thermally conditioning a probe card prior to testing a device (DUT) in accordance with some embodiments of the invention. The method 500 is described below with reference to FIGS. 1 and 2. Although the method 500 is described with respect to the probe card 100 of FIG. 1, the method is also applicable to other probe card configurations, including but not limited to probe cards 300, 400 respectively depicted in FIGS. 3-4.

The method 500 generally begins at 502 where power may be provided from a second power source external to a tester to a thermal management apparatus disposed on a probe card having a first connector coupled to the thermal management apparatus for connecting to a first power source internal to the tester and a second connector, different than the first connector, coupled to the thermal management apparatus and connected to the second power source. For example, a probe card 100 may be provided having a thermal management apparatus 130 disposed thereon. The probe card 100 further includes a first connector (e.g., 104) and a second connector (e.g., 152), different than the first, for coupling power to the thermal management apparatus 130. Power may be provided to the thermal management apparatus 130 via a second power source 150 external to the tester that is different than a first power source (e.g., 250) internal to the tester.

Next, at 504, the probe card 100 may be brought to a desired temperature using the thermal management apparatus 130. In some embodiments, the probe card 100 may be brought to a desired temperature using the thermal management apparatus 130 prior to installing the probe card 100 in a tester (such as the prober 226).

In some embodiments, the temperature controller 134 may detect that the probe card 100 is not disposed in the tester and may control the temperature control device 132 accordingly. For example, if the temperature of the probe card is more than a first predetermined difference from the desired temperature, the temperature controller 134 may control the temperature control device 132 to more rapidly heat and/or cool the probe card 100 to reduce the time required to reach the desired temperature. If the temperature of the probe card is less than a second predetermined difference from the desired temperature, which may be the same or different than the first predetermined difference, then the temperature controller 134 may control the temperature control device 132 to reduce the rate at which the probe card 100 is being heated or cooled to avoid overshooting the desired temperature.

In some embodiments, the desired temperature may be, for example, an operating temperature at which DUT testing using the probe card 100 is to be performed. In some embodiments, the desired temperature may be a temperature selected to compensate for changes in temperature that occur when installing the probe card 100 in the tester. For example, in embodiments where the probe card 100 is heated, the desired temperature may be greater than an operating temperature at which DUT testing using the probe card 100 is to be performed to compensate for the loss in temperature that may occur when the probe card 100 is handled to install the probe card 100 in the tester. Upon reaching the desired temperature, the method 500 generally ends and the thermally conditioned probe card 100 is ready to be installed in a tester for DUT testing.

Upon reaching the desired temperature, the probe card 100 may be disposed in the tester. For example, the probe card 100 may be installed in the prober 226. In some embodiments, the probe card 100 may then be disconnected from the second power source 150 (or the temperature controller 134 may inactivate the thermal control device 132). In some embodiments, the probe card 100 may continue to be coupled to the second power source 150 and the temperature controller 134 may continue to control the thermal control device 132 to facilitate maintaining the probe card 100 at the desired temperature, or at second desired temperature different than the first, or initial desired temperature (for example, when changing test temperatures). In some embodiments, the probe card 100 may be coupled to a different second power source 150, such as when the probe card 100 is coupled to a second power source 150 remote from the tester, then once installed in the tester, the probe card 100 may be coupled to a second power source disposed in the tester.

In some embodiments, a determination may be made whether the first or second connectors are receiving power and the determination may be indicated to a controller (e.g., 134) of the thermal management apparatus 130. For example, the temperature controller 134 may receive an indication (e.g., from indicating device 138, or indicating circuitry 802) whether either or both of the first or second connectors are receiving power. In some embodiments, the operation of the thermal management apparatus 130 may be varied in accordance with whether one or both of the first and second connectors are receiving power. For example, the thermal management apparatus 130 may operate in accordance with whether one or both of the first and second connectors are receiving power using, for example, the control means, as discussed above. In some embodiments, an amount of power drawn through the first connector may be limited to an operational amount that is less than a maximum amount of power that can be drawn through the first connector, for example, using the means for limiting discussed above.

Figure 6:
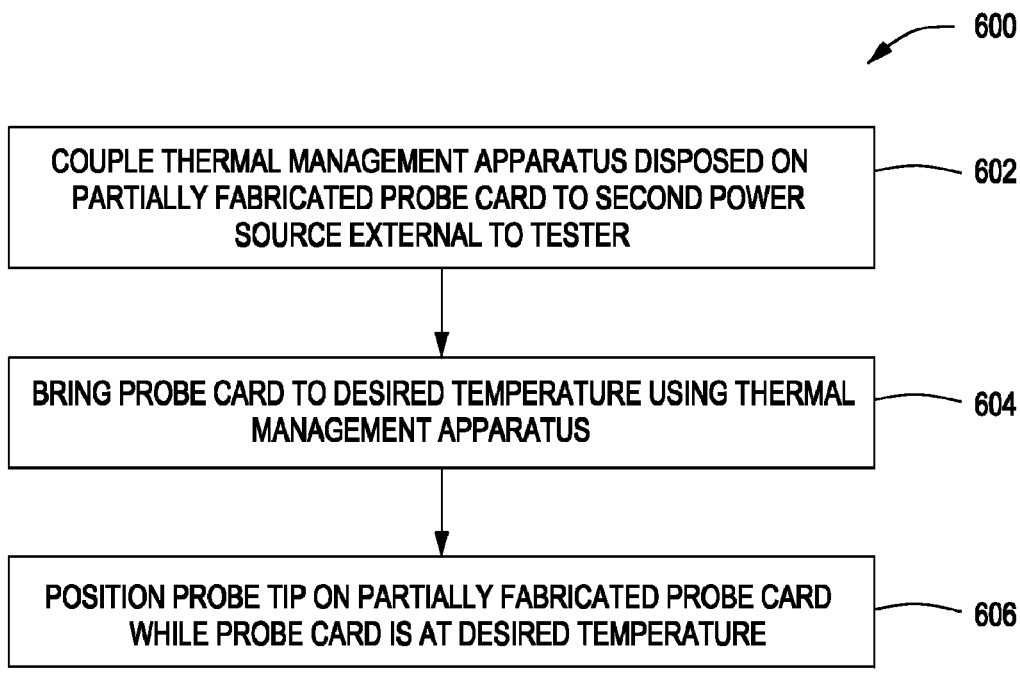
FIG. 6 depicts a flow chart of a method for fabricating a probe card for testing a device (DUT) in accordance with some embodiments of the invention.

FIG. 6 depicts a flow chart of a method 600 for fabricating a probe card for testing a device (DUT) in accordance with some embodiments of the invention. The method 600 is described with respect to the probe card 100 of FIG. 1, but is applicable to other probe card configurations, including but not limited to probe cards 300, 400 respectively depicted in FIGS. 3-4. The method 600 generally begins at 602 where a thermal management apparatus 130 disposed on a partially fabricated probe card 100 may be coupled to a second power source 150 external to a tester. The second power source 150 may be different than a first power source 250 that powers the probe card 100 during DUT testing. Next, at 604, the partially fabricated probe card 100 may be brought to a desired temperature using the thermal management apparatus 130. For example, during a test or assembly of the probe card 100 of FIG. 1, the temperature control device 132 may be coupled to the second power source 150 and controlled (e.g., via the temperature controller 134) to bring, for example, the wiring substrate 102 and/or other components coupled to the wiring substrate 102, to a desired temperature. Next, at 606, a tip of a probe 114 (or in some embodiments, a probe substrate 124) may be positioned on the partially fabricated probe card 100 while the probe card 100 is at the desired temperature. For example, the probe 114 may be positioned with respect to the wiring substrate 102 via the bracket 122 or other positioning devices that may be provided dependent upon the probe card design and configuration. Alternatively, the method 600 may be performed on a fully fabricated probe card to compare the actual positions of the probes at a desired temperature or range of temperatures to respective desired positions of the probes at the desired temperature or range of temperatures. Thus, at 606, the probe, or probe substrate, may be repositioned on the probe card 100 while the probe card 100 is at the desired temperature in order to place the probe (or the probe substrate having probes disposed thereon) in a desired position.

Figure 7:
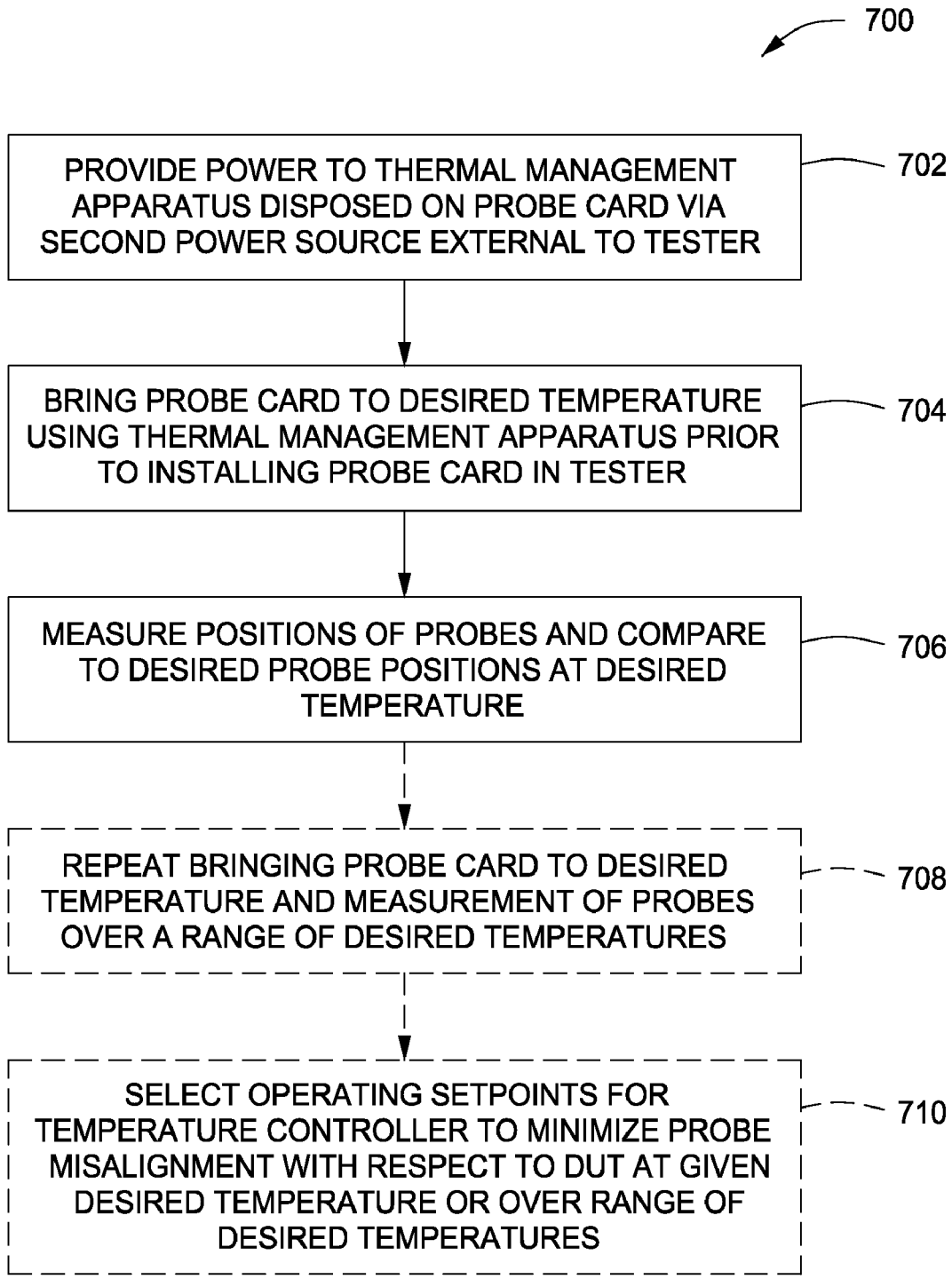
FIG. 7 depicts a flow chart of a method for fabricating a probe card for testing a device (DUT) in accordance with some embodiments of the invention.

FIG. 7 depicts a flow chart of a method 700 for fabricating a probe card for testing a device (DUT) in accordance with some embodiments of the invention. The method 700 generally begins at 702 where power is provided to a thermal management apparatus 130 disposed on a probe card via a second power source different than a first power source that powers the probe card during DUT testing. At 704, the probe card is brought to a desired temperature using the temperature control device prior to installing the probe card the tester. As discussed above, the probe card may be heated or cooled by the temperature control device to reach the desired temperature. Next, at 706, the respective positions of the probes may be measured and compared to respective desired probe positions at the desired temperature. Optionally, at 708, the probe card may be brought to another desired temperature (e.g., repeat 702 at new desired temperature) and the respective positions of the probes may again be measured and compared to respective desired probe positions at the new desired temperature (e.g., repeat 704 at new desired temperature).

Comparing the desired probe positions to the actual positions at a given desired temperature, or over a range of desired temperatures, allows for the design and/or assembly of the probe card to be verified. Where the actual positions of the probes are different than the desired positions by too great a margin (e.g., outside of a desired tolerance), the probe card may be flagged for inspection, re-assembly, or re-design, or some other action taken. For example, the positioning of the probe substrates or other components of the probe card that may affect probe positions may be verified or flagged if found to be in error. Alternatively, a coefficient of thermal expansion of the probe card or of components thereof (for example, the wiring substrate 102, the interposer substrate 310, or the support substrate 402) may be determined, confirmed, and/or compensated for by comparing the actual probe positions to the desired probe positions.

Optionally, feedback from the above measurements and comparisons can be provided to the probe card in order to improve scrub margin performance (e.g., to minimize the global misalignment of all probes on the probe card with respect to the corresponding terminals of a DUT). For example, at 710, in response to the measurement of the probe positions, operating setpoints for the temperature controller may be selected (or altered) to reduce, or minimize, probe misalignment with respect to the terminals of the DUT at the desired temperature or over a range of desired temperatures.

Thus, embodiments of probe cards capable of being thermally conditioned outside of a tester and methods for designing, fabricating, testing, and using same are provided herein. Embodiments of the present invention may advantageously allow for more accurate design and/or testing of probe cards by allowing such design and test to occur at operating/testing temperatures utilized to test a device. Embodiments of the present invention may advantageously allow for more accurate assembly of probe cards by allowing such assembly to occur at operating/testing temperatures. Embodiments of the present invention may advantageously allow for reduction of downtime of a tester by facilitating thermal conditioning of the probe card to occur outside of the tester.

While the foregoing is directed to embodiments of the present invention, other and further embodiments of the invention may be devised without departing from the basic scope thereof, and the scope thereof is determined by the claims that follow.

The invention claimed is:

1. An apparatus for testing a device (DUT), comprising:
a probe card configured for testing a DUT;
a thermal management apparatus disposed on the probe card to heat and/or cool the probe card;
a sensor disposed on the probe card and coupled to the thermal management apparatus to provide data to the thermal management apparatus corresponding to a temperature of a location of the probe card;
a first connector disposed on the probe card and coupled to the thermal management apparatus for connecting to a first power source internal to a tester; and
a second connector, different than and electrically insulated from the first connector, disposed on the probe card and coupled to the thermal management apparatus for connecting to a second power source external to the tester,
wherein the thermal management apparatus includes control means configured to change an operational mode of the thermal management apparatus depending on whether the first connector but not the second connector is receiving power, the second connector but not the first connector is receiving power, or both the first connector and the second connectors are receiving power.

2. The apparatus of claim 1, wherein the thermal management apparatus comprises:
a device for heating and/or cooling; and
a temperature controller coupled to, and for controlling, the device for heating and/or cooling in response to the data of the sensor.

3. The apparatus of claim 2, wherein the sensor is integral with the device for heating and/or cooling.

4. The apparatus of claim 2, further including an indicating device for indicating to the temperature controller whether the first or second connectors are receiving power.

5. The apparatus of claim 1, further including means for limiting an amount of power drawn through the first connector.

6. The apparatus of claim 1, wherein the second power source is a battery.

7. The apparatus of claim 1, wherein the second power source is an AC power outlet.

8. The apparatus of claim 7, wherein the second power source further comprises: a DC power supply plugged into the AC power outlet.

9. The apparatus of claim 1, further comprising:
a tester having the probe card installed therein; and
a second power source external to the tester connected to the second connector.

10. The apparatus of claim 9, wherein the tester further comprises a first power source, and wherein the first power source is connected to the first connector.

11. The apparatus of claim 1, wherein the control means is configured, when both the first connector and the second connector are receiving power, to cause the thermal management apparatus to draw full power to heat or cool the probe card from the power being received by the second connector.

12. The apparatus of claim 1, wherein the control means is configured, when both the first connector and the second connector are receiving power, to cause the thermal management apparatus to draw full power to heat or cool the probe card from the power being received by the second connector before drawing power to heat or cool the probe card from the power being received by the first connector.

13. An apparatus for testing a device (DUT), comprising:
a probe card configured for testing a DUT;
a device for heating and/or cooling the probe card;
a temperature controller coupled to, and for controlling, the device for heating and/or cooling the probe card;
a sensor disposed on the probe card and coupled to the temperature controller to provide data to the temperature controller corresponding to a temperature of a location of the probe card;
a first connector disposed on the probe card and coupled to the thermal management apparatus for connecting to a first power source internal to a tester; and
a second connector, different than and electrically insulated from the first connector, disposed on the probe card and coupled to the thermal management apparatus for connecting to a second power source external to the tester.

* * * * *